(12) United States Patent
Kanbara et al.

(10) Patent No.: US 8,404,968 B2
(45) Date of Patent: Mar. 26, 2013

(54) PHOTOVOLTAIC POWER GENERATING SYSTEM

(75) Inventors: Tatsuji Kanbara, Higashiomi (JP); Hiroaki Hirata, Higashiomi (JP); Hideaki Fukui, Ise (JP); Kenichiro Sumida, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 261 days.

(21) Appl. No.: 12/919,733

(22) PCT Filed: Feb. 27, 2009

(86) PCT No.: PCT/JP2009/053683
§ 371 (c)(1),
(2), (4) Date: Aug. 26, 2010

(87) PCT Pub. No.: WO2009/107776
PCT Pub. Date: Sep. 3, 2009

(65) Prior Publication Data
US 2011/0005581 A1  Jan. 13, 2011

(30) Foreign Application Priority Data
Feb. 28, 2008 (JP) ................................. 2008-047042
Oct. 29, 2008 (JP) ................................. 2008-277710

(51) Int. Cl.
*H02N 6/00* (2006.01)
(52) U.S. Cl. ........................................ 136/251; 136/244
(58) Field of Classification Search .................... 136/251
See application file for complete search history.

(56) References Cited

U.S. PATENT DOCUMENTS

| 5,112,408 | A | * | 5/1992 | Melchior | 136/251 |
| 5,505,788 | A | * | 4/1996 | Dinwoodie | 136/246 |
| 5,746,839 | A | * | 5/1998 | Dinwoodie | 136/251 |
| 6,498,289 | B1 | | 12/2002 | Mori et al. | 136/244 |
| 2010/0132761 | A1 | | 6/2010 | Echizenya et al. | |

FOREIGN PATENT DOCUMENTS

| JP | 02-089856 | 7/1990 |
| JP | 10-054118 | 2/1998 |
| JP | 2003-105940 | 4/2003 |
| JP | 2003105940 A | 4/2003 |
| JP | 2004-006625 | 1/2004 |
| JP | 2004-087884 | 3/2004 |
| JP | 2004087884 A | 3/2004 |
| JP | 2004-146765 | 5/2004 |
| JP | 2006-278535 | 10/2006 |
| JP | 2006-278537 | 10/2006 |
| WO | WO 2008/136095 A1 | 11/2008 |

* cited by examiner

*Primary Examiner* — Jeffrey T Barton
*Assistant Examiner* — Niki Bakhtiari
(74) *Attorney, Agent, or Firm* — DLA Piper LLP (US)

(57) ABSTRACT

A photovoltaic power generating system of the present invention includes a solar cell module 1, an installation platform 2 for holding a pair of ends of the solar cell module 1, and at least one supporting member 3 disposed on a side of a non-light-receiving surface 1B of the solar cell module 1, wherein the supporting member 3 is disposed at such a distance from the non-light-receiving surface 1B of the solar cell module 1 that the supporting member 3 can abut against the non-light-receiving surface 1B by deformation of the solar cell module 1. A deforming amount of the solar cell module 1 is increased in accordance with an external force applied to the solar cell module 1.

6 Claims, 13 Drawing Sheets

PHOTOVOLTAIC POWER GENERATING SYSTEM

TECHNICAL FIELD

The present invention relates to a photovoltaic power generating system.

BACKGROUND ART

As interest in environmental protection is increased in recent years, photovoltaic power generating systems having lower environment load have come to attention. To get the photovoltaic power generating systems widespread use, cost reduction is considered.

For reducing the cost, it is proposed to provide a solar cell module of frameless (sashless) structure, or to increase an area of a power generator of the solar cell module. However, these proposals may cause deterioration of the strength. For example, since the solar cell module of frameless structure has low rigidity, the module easily bends, and the solar cell module is easily broken. If the area of the solar cell module is increased, a wind pressure and a snow accumulation load applied to one sheet of solar cell module are increased. Therefore, like the case of the solar cell module of frameless structure, a bending amount of a light-receiving surface of the solar cell module is increased, a transparent substrate easily falls off, and a crack is easily produced in the solar cell element.

To solve this problem, it is proposed to dispose a supporting member that supports a central part of the solar cell module (e.g., refer to Japanese Patent Application Laid-Open Nos. 2004-087884 and 2003-105940).

According to the above conventional techniques, however, since the supporting member is provided such that it is in contact with a non-light-receiving surface of the solar cell module, an absolute value of bending moment that is applied to the solar cell module becomes maximum in a central part that is the supporting part. Therefore, when a positive pressure load is applied, stresses are concentrated on the central part. That is, a radius of curvature of the solar cell module surface becomes small and abrupt bending is produced. If the radius of curvature becomes smaller than a certain limit value, the solar cell module is broken due to a fracture of the transparent substrate, a crack of the solar cell element or the like.

Further, since the solar cell module and the supporting member axe in a state where they abut against each other, there is a problem that flow (ventilation) of air along a back surface of the solar cell module is hindered, and heat of the solar cell module cannot be sufficiently radiated.

There is an adverse possibility that water such as rain water is remained in the abutted part. In this case, there is an adverse possibility that the back surface protection material used for the solar cell module is deteriorated due to remain of water for a long time. If water permeates through the back surface protection material, ethylene vinyl acetate (EVA) that is used as filler for sealing the solar cell element absorbs water to generate acetic acid, and there is an adverse possibility that a wiring member is damaged.

DISCLOSURE OF THE INVENTION

It is an object of the present invention to provide a photovoltaic power generating system having excellent heat-radiation performance and improved load-carrying capacity.

A photovoltaic power generating system according to one embodiment of the present invention includes a solar cell module, an installation platform for holding a pair of ends of the solar cell module, and at least one supporting member disposed on a side of a non-light-receiving surface of the solar cell module, wherein the supporting member is disposed at such a distance from the non-light-receiving surface of the solar cell module that the supporting member can abut against the non-light-receiving surface by deformation of the solar cell module.

According to the photovoltaic power generating system, the supporting member is disposed at a position where it can abut against the solar cell module that is bent by a positive pressure load. Therefore, the maximum absolute value of the bending moment of the solar cell module can be reduced as compared with a case where the supporting member is disposed such that it is in contact with the solar cell module, and the load-carrying capacity of the photovoltaic power generating system can be increased.

Further, ventilation can be secured by the gap between the solar cell module and the supporting member. According to this, the solar cell module can be cooled and reduction in power generating efficiency can be suppressed.

BRIEF DESCRIPTION OF THE DRAWINGS

FIGS. 1A and 1B a view showing a photovoltaic power generating system according to a first embodiment of the present invention.

FIGS. 3A and 3B are sectional views taken along line P-P' shown in FIG. 1B.

FIGS. 4A to 4D are a modeled schematic diagram showing a relation between the positive pressure load applied to the solar cell module and bending of the solar cell module.

FIGS. 8A and 8B are views showing a photovoltaic power generating system according to a third embodiment of the present invention.

FIG. 9A and 9B are sectional views taken along line A-A' shown in FIG. 8B.

FIGS. 13A to 13C are views showing a photovoltaic power generating system according to a sixth embodiment of the present invention.

FIGS. 14A to 14C are views showing a photovoltaic power generating system according to a seventh embodiment of the present invention. FIGS. 15A to 15C are views showing a modification that can be applied to the photovoltaic power generating system of each of the embodiments of the present invention.

BEST MODE FOR CARRYING OUT THE INVENTION

A photovoltaic power generating systems according to the present invention will be described below with reference to the accompanying drawings.

<<First Embodiment>>
<Photovoltaic Power Generating System>

Figure 1A:
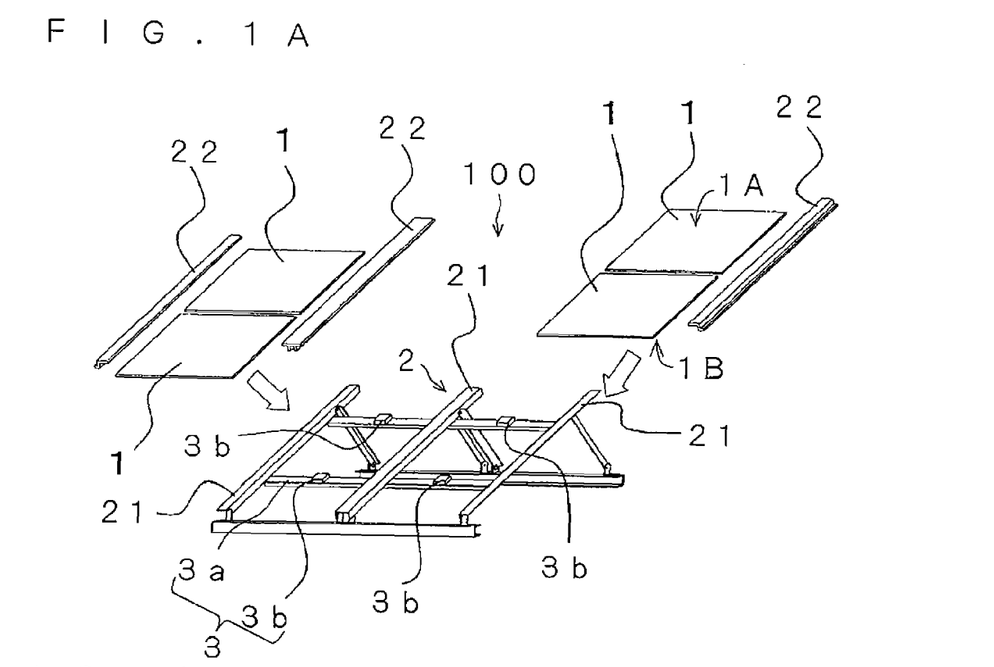
FIG. 1A is an exploded perspective view showing a state before solar cell modules are installed.
Figure 1B:
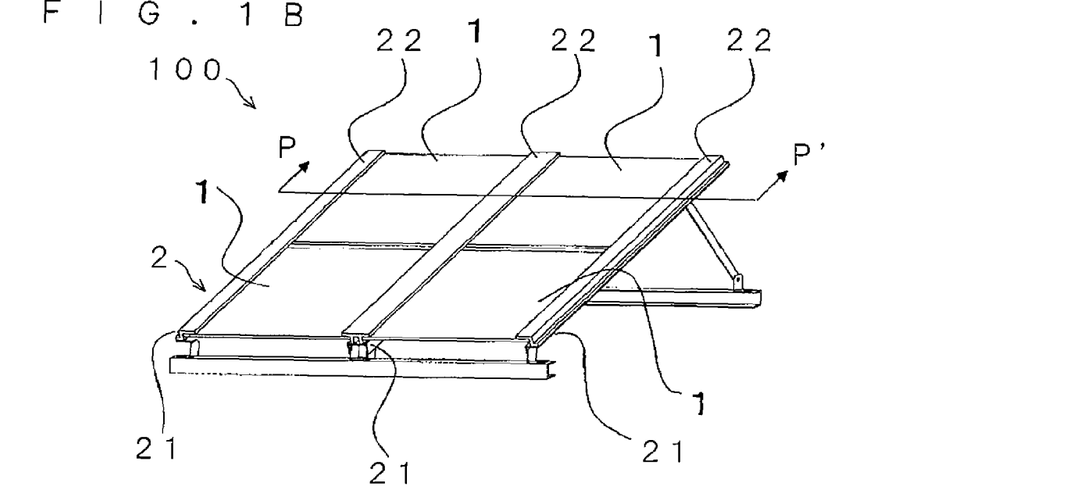
FIG. 1B is a perspective view showing a state after the solar cell modules are installed.

As shown in FIGS. 1A and 1B, a photovoltaic power generating system 100 generally includes solar cell modules 1, an installation platform 2, and supporting member 3. It is only necessary that the installation platform 2 holds a pair of ends (ends of opposed sides) of the solar cell modules 1 and for example, the installation platform 2 includes a plurality of holding members 21, and a plurality of locking members 22 that sandwich and fix the ends of the solar cell modules 1 together with holding members 21. The supporting member 3 is provided on the side of a non-light-receiving surface of the solar cell module 1.

<Solar Cell Module>

The solar cell module 1 can employ various structures such as a superstrate structure, a glass package structure and a substrate structure. Solar cell modules of the superstrate structure will be described as an example. The superstrate structure can be applied to monocrystalline silicon solar cells and polycrystalline silicon solar cells that are manufactured in high quantities, and this structure is preferable because an amount of material used is small.

Figure 2:
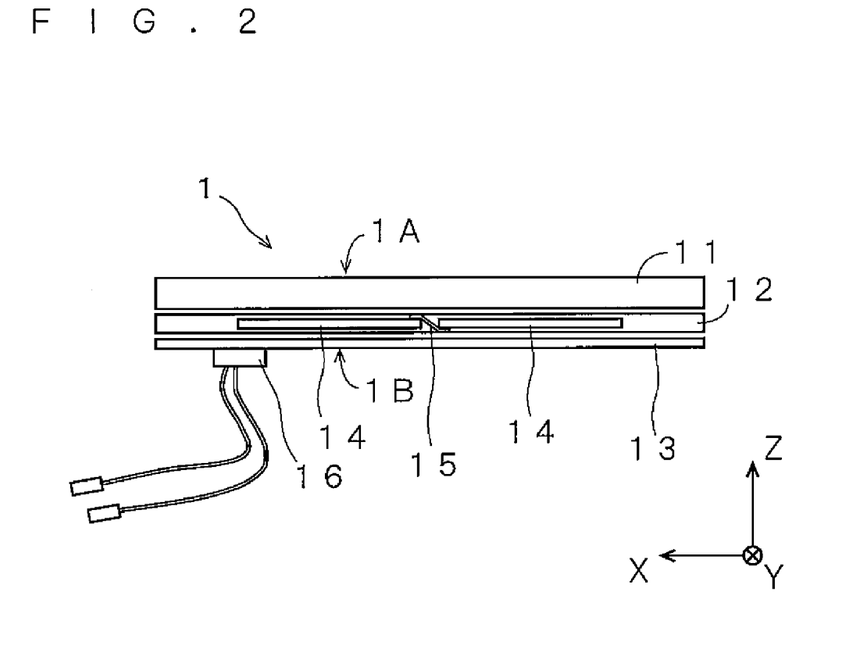
FIG. 2 is a sectional view showing the section of the solar cell module according to the first embodiment.

In FIG. 2, the solar cell module 1 is formed by laminating a transparent substrate 11 that also functions as a module substrate, a filler 12 made of clear thermosetting resin, and a back surface protection film 13 that protects on the side of the non-light-receiving surface 1B, in this order from the side of a light-receiving surface 1A. A plurality of solar cell elements 14 that carry out photoelectric conversion are sealed in the filler 12, and the plurality of solar cell elements 14 are electrically connected to each other through an inner lead 15. A terminal box 16 is provided on the solar cell module 1 on the side of the non-light-receiving surface 1B. Electricity obtained by the photoelectric conversion carried out by the solar cell elements 14 is outputted to outside through the terminal box 16. The solar cell module 1 is one example of a frameless type solar cell module having no frame that protects an outer periphery of the solar cell module.

A monocrystalline silicon solar cell, a polycrystalline silicon solar cell, a thin film solar cell, a CIGS solar cell, a CdTe solar cell, an HIT type solar cell and the like are suitably employed as the solar cell element 14. A solar cell element 14 of about 15 cm square is generally employed in the case of the monocrystalline silicon solar cell, the polycrystalline silicon solar cell and the HIT type solar cell.

<Installation Platform>

As described above, the installation platform 2 includes the holding members 21 and the locking members 22. The holding members 21 have roles to hold the solar cell modules 1 mainly from below (on the side of the non-light-receiving surface 1B). Carbon steel, stainless steel, aluminum or the like can suitably be utilized as material of the holding member 21. It is preferable that a supporting surface of the holding member 21 is protected by galvanization, corrosion-resistant aluminum alloy coating, painting or the like.

The locking members 22 have roles to fix the solar cell module 1 held by the holding members 21. The locking member 22 can use the same material as that of the holding member 21.

<Supporting Member>

Carbon steel, stainless steel, aluminum, galvanized metal, alumite-coated metal, resin-molded product such as rubber and plastic and corrosion-resistant woods are used as material of the supporting member 3 for example.

FIG. 1A shows a case where the supporting members 3 are rectangular parallelepiped shaped members 3a and members 3b, but the shapes of the supporting member 3 are not limited to those. For example, the shape of the member 3b may be columnar. The supporting member 3 may be of columnar shape having substantially the same length as that of the solar cell module 1 in a longitudinal direction or a lateral direction. However, to reduce the back surface protection film 13 from being damaged, it is preferable that the supporting surface (surface that can abut against the non-light-receiving surface 1B) 3S of the supporting member 3 is smooth and does not have a projection, and its edge portion is rounded.

Figure 3A:
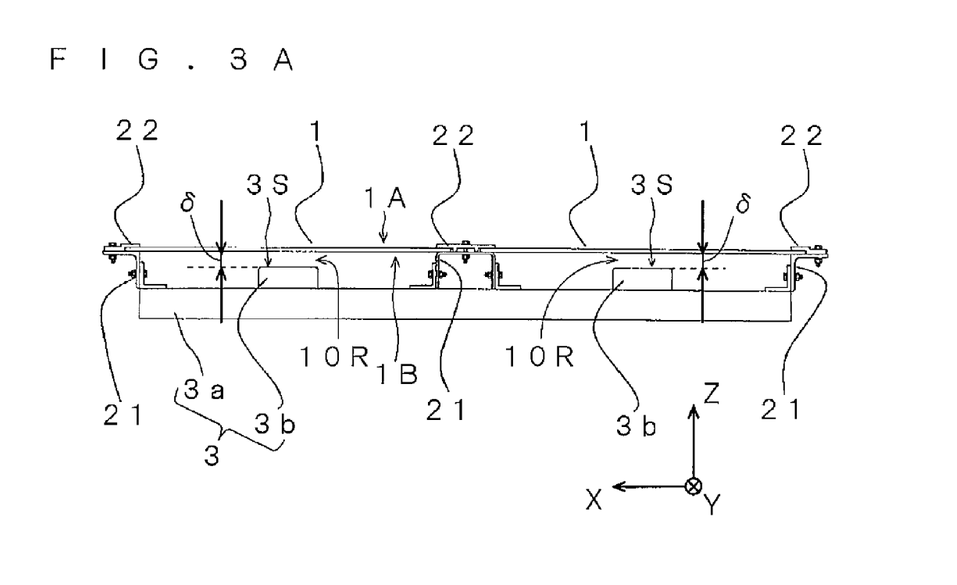
FIG. 3(a) 3A shows a state where a positive pressure load is not applied to the solar cell modules from external.

As shown in FIG. 3A, the supporting member 3 is disposed such that it separates from the non-light-receiving surface 1B of the solar cell module 1. Therefore, when a positive pressure load is not applied from external, a space 10R (air layer) through which air flow is formed between the solar cell module 1 and the supporting member 3.

Since the space 10R is provided, water such as rain water is less likely to remain as compared with a case where the supporting surface 3S and the non-light-receiving surface 1B abut against each other.

The space 10R makes it easy to grasp both sides of the solar cell module 1. Therefore, even if the solar cell module 1 is increased in size, its construction performance is excellent.

Figure 3B:
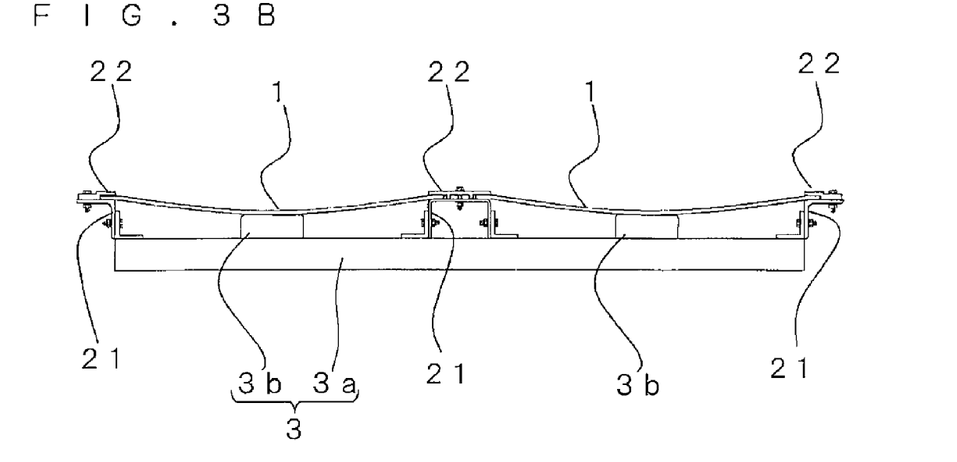
FIG. 3(b) 3B shows a state where the positive pressure load is applied to the solar cell modules from external.

As shown in FIG. 3B, if a positive pressure load is applied to the solar cell module 1 from the side of the light-receiving surface 1A, the solar cell module 1 is deformed (bent). The supporting member 3 is disposed at a position where it can abut against the non-light-receiving surface 1B by deformation of the solar cell module 1, and supports the solar cell module 1. A deforming amount of the solar cell module 1 is increased in accordance with a positive pressure load caused by an external force applied to the solar cell module 1, e.g., a wind pressure and a snow accumulation load. A distance between the solar cell module 1 and the supporting member 3 is set such that at least destruction such as a fracture does not occur, and the supporting member 3 abuts against the bent solar cell module 1. That is, this distance is set such that before the solar cell module 1 is destroyed, the supporting member 3 supports a central part of the solar cell module 1.

Next, with reference to FIGS. 4A to 4D and 5, a description will be given of bending moment applied to the solar cell module 1 when a positive pressure load is applied to the solar cell module 1 provided in the photovoltaic power generating system 100 having the above-described configuration. However, the positive pressure load is a uniformly-distributed load. in FIGS. 4A to 4D and 5, positions A and C correspond to positions of both ends of the solar cell module 1 held by the holding members 21. A position B corresponds to a position of a central part of the solar cell module 1 supported by the supporting member 3.

Figure 4A:
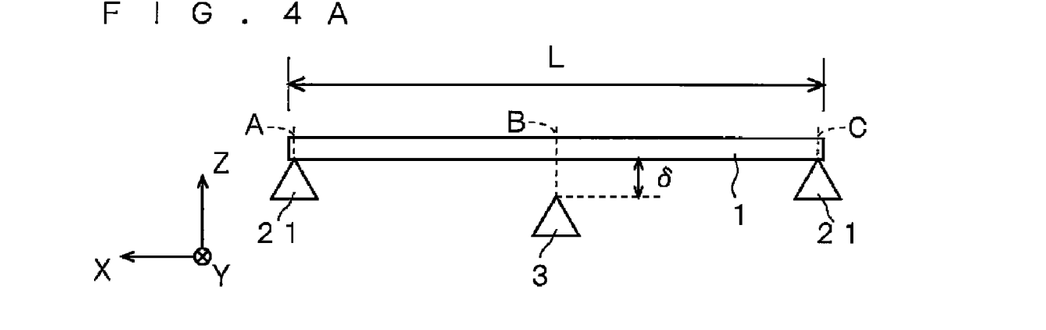
FIG. 4A shows a state where the positive pressure load is not applied from external.

When a positive pressure load is not applied to the solar cell module 1 from external as shown in FIG. 4A, since a bending degree of the solar cell module 1 is small, the solar cell module 1 and the supporting member 3 are separated from each other. In this case, it can be perceived that the supporting structure of the solar cell module 1 is a simple supporting beam.

Figure 4B:
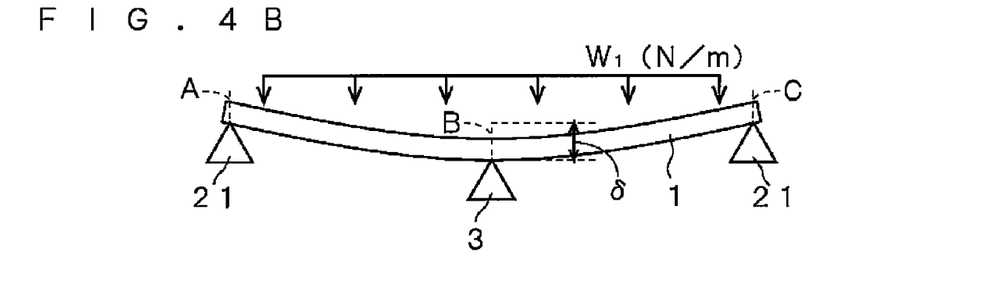
FIG. 4B shows a state where a distributed load $W_1$ (N/m) corresponding to a minimum positive pressure load required for abutting the solar cell module against the supporting member is applied.

If a distributed load $W_1$ is applied to the solar cell module 1, the non-light-receiving surface of the solar cell module 1 and the supporting member 3 come into contact with (abutment against) each other (FIG. 4B). At this point, it can be perceived that the supporting structure of the solar cell module 1 is a continuous beam having three fulcrum points as shown in FIG. 4B.

Figure 4C:
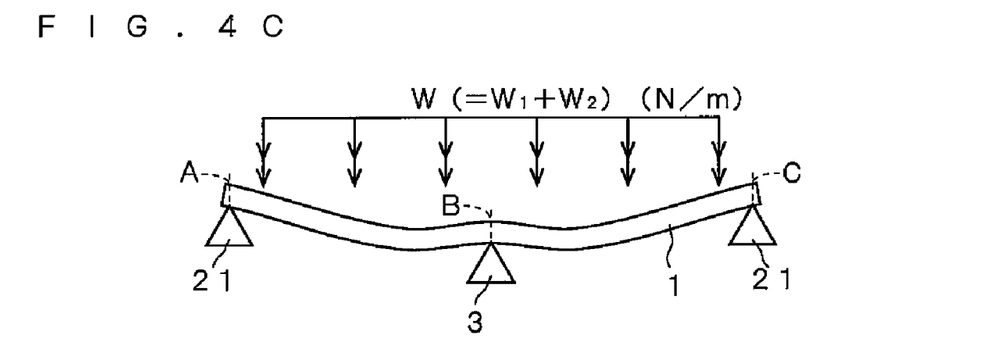
FIG. 4C shows a state where a distributed load W (N/m) is applied to the solar cell module (where, $W>W_1$).

Further, if a distributed load W that is greater than the distributed load $W_1$ is applied to the solar cell module 1, the solar cell module 1 is bent as shown in FIG. 4C. This is a state where a distributed load $W_2$ (=$W-W_1$) is further applied to the solar cell module 1 to which the distributed load $W_1$ is applied and which starts being supported by the supporting member 3 (FIG. 4B). That is, it can be considered that the state shown in FIG. 4C is a state in which a state where only the distributed load $W_1$ is applied as shown in FIG. 4B and the state where the distributed load $W_2$ is applied to the solar cell module 1 whose central part is supported by the supporting member 3 from the beginning as shown in FIG. 4D are superposed on each other.

Figure 4D:
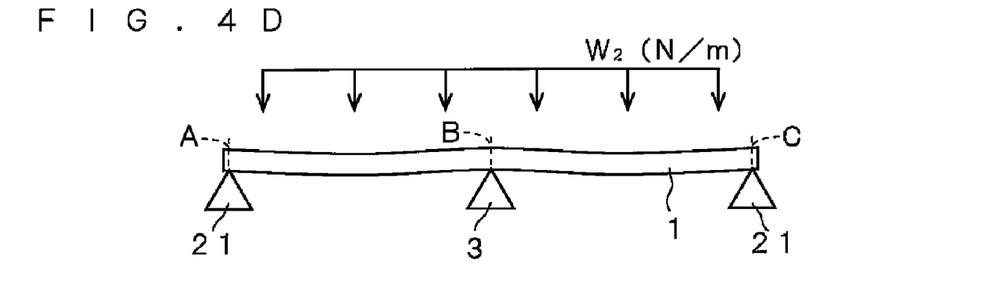
FIG. 4D shows a state where a distributed load $W_2$ (N/m) that is a difference between the distributed load W and the distributed load $W_1$ is applied to the solar cell module in a situation that the supporting member and the solar cell module are disposed without forming a space therebetween.
Figure 5:
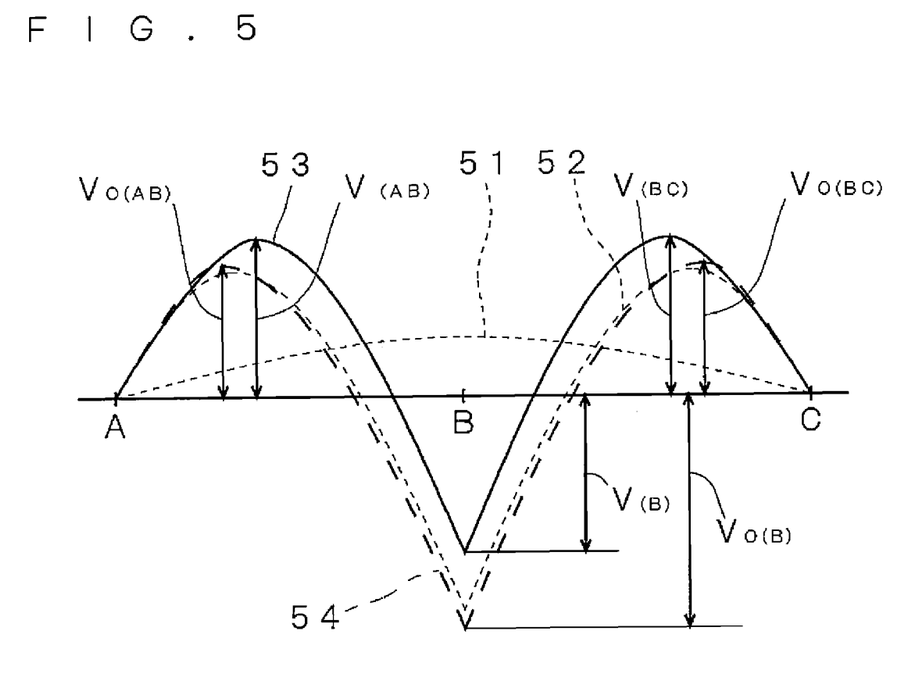
FIG. 5 a diagram showing a bending moment diagram of the solar cell module in the states shown in FIGS. 4B, 4C and 4D.

FIG. 5 is a bending moment diagram of the solar cell module 1 in each of the states shown in FIGS. 4B, 4C and 4D. In FIG. 5, a moment diagram 51 corresponds to bending moment $M_1$ of the solar cell module 1 in the state shown in FIG. 4B. A moment diagram 52 corresponds to bending moment $M_2$ of the solar cell module 1 in the state shown in FIG. 4D. A moment diagram 53 in which the bending moment $M_1$ and the bending moment $M_2$ are synthesized with each other based on a principle of superposition corresponds to the bending moment M generated in the solar cell module 1 in the state shown in FIG. 4C where the distributed load W is applied. In FIG. 5, a moment diagram 54 shows bending moment when the distributed load W is applied to a conventional solar cell module that abuts against a supporting member in a state where no load is applied.

Here, the moment diagram 53 when a positive pressure load is applied to the solar cell module 1 of the present embodiment and the bending moment diagram 54 of the conventional case are compared with each other.

In any of the moment diagrams 53 and 54, bending moment becomes the minimum value (negative value) at a position B and becomes the maximum value (positive value) between positions A and B, and between positions B and C.

In this embodiment, since the supporting member 3 is disposed such that it separates from the solar cell module 1, if a distributed load W is applied to the solar cell module 1, in the position B, negative bending moment is generated by the distributed load $W_2$ as shown with the moment diagram 52 from a state where positive bending moment is generated by the distributed load $W_1$ as shown with the moment diagram 51. Therefore, as compared with the conventional configuration, the magnitude of the bending moment at the position B becomes small ($V_{(B)} < V_{0(B)}$).

A difference ($V_{(AB)} - V_{(B)}$ and $V_{(BC)} - V_{(B)}$) between an absolute value of the maximum value and an absolute value of the minimum value of the moment diagram 53 is smaller than a difference ($V_{0(AB)} - V_{0(B)}$ and $V_{0(BC)} - V_{0(B)}$) between an absolute value of the maximum value and an absolute value of the minimum value of the moment diagram 54. That is, by disposing the supporting member 3 such that it separates from the solar cell module 1, the maximum absolute value and the minimum absolute value of the bending moment of the solar cell module 1 when a positive pressure load is applied can be brought close to each other.

If a stress at a position of one of the maximum value and the minimum value of bending moment that has a greater absolute value exceeds a permissible value, destruction of the solar cell module 1 is caused at this position. Therefore, in order to suppress a breakage of the solar cell module 1 to the maximum extent possible, it is preferable that a distance between the solar cell module 1 and the supporting member 3 is set such that when a distributed load $W_0$ that is assumed to be applied is applied to the solar cell module 1, a distance δ in which the absolute value ($V_{(AB)}$ and $V_{(BC)}$) of the maximum bending moment M and the absolute value ($V_{(B)}$) of the minimum bending moment M of the solar cell module 1 become equal to each other is a maximum value.

In order to equalize the absolute value of the maximum value and the absolute value of the minimum value of the bending moment, a value of the distance δ should be set such that a ratio of the distributed loads $W_1$ and $W_2$ becomes $W_1:W_2=1:15$. For example, if a distributed load of 3000 (N/m) is applied as a permissible maximum load when the solar cell module 1 is approximated to a model shown in FIG. 4A, values of $W_1$ and $W_2$ become $W_1:W_2=187.5$ (N/m): 2812.5 (N/m). The permissible maximum load is a maximum load that is assumed to be applied to the solar cell module 1, and is a load that is set by a designer and the like of the photovoltaic power generating system 100.

A distance δ in which an absolute value of the maximum value and an absolute value of the minimum value of bending moment of the solar cell module 1 become equal to each other when a distributed load $W_0$ (N/M) is applied is expressed by the following equation wherein a width L of the solar cell module 1 is 2 S (m) and Young's modulus is E (N/m$^2$) and second moment of area is I (m$^4$):

$$\delta = 5W_1 L^4/(384EI) = 5W_0 S^4/(384EI) \qquad \text{Equation (1)}$$

The photovoltaic power generating system 100 of the embodiment having the above-described configuration has the following effect.

When the positive pressure load applied to the solar cell module 1 is small, the solar cell module 1 is supported by the holding members 21. If a positive pressure load of more than a predetermined amount is applied, the solar cell module 1 is bent, and the non-light-receiving surface 1B is abutted against the supporting member 3 and supported by the supporting member 3. According to this, it is possible to reduce the bending moment that is applied at the position of the supporting member 3 as compared with a case where the supporting member 3 abuts from the beginning. According to this, the load-carrying capacity of the photovoltaic power generating system 100 can be enhanced.

When no positive pressure load is applied to the solar cell module 1 as shown in FIG. 3A, the supporting member 3 is not in contact with the solar cell module 1 on the side of the non-light-receiving surface 1B, and since air can flow through the space 10R of the solar cell module 1 on the side of the non-light-receiving surface 1B, a cooling effect can be obtained. When the sky is clear and there is no wind for example, the solar cell module 1 can be cooled by convection heat transfer caused by natural convection generated on the side of the non-light-receiving surface 1B of the solar cell module 1, and high power generating efficiency can be maintained.

The supporting member 3 can be applied to a solar cell module 1a having frames 4. A configuration of the solar cell module 1a having the frames 4 will be described with reference to FIG. 6.

Figure 6:
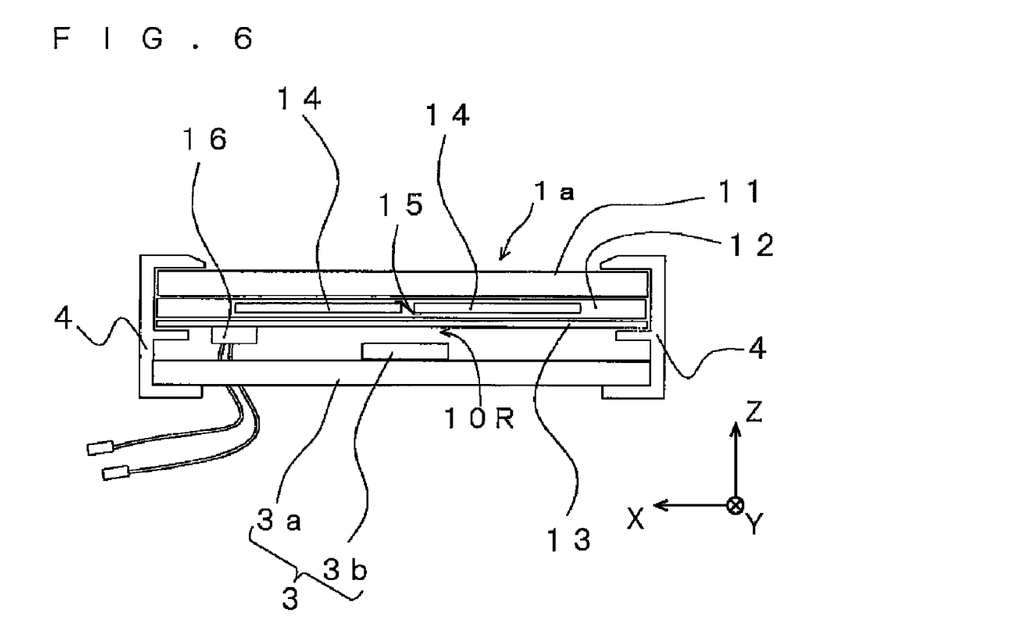
FIG. 6 a view showing a modification of the photovoltaic power generating system according to the first embodiment of the present invention.

If a periphery of a body part of the solar cell module 1a is attached to the frames 4 as shown in FIG. 6, the body part can be protected and its strength can be increased. It is possible to omit the holding members 21 and locking members 22 by mounting the frames 4 on the installation platform 2 shown in FIGS. 1A and 1B.

By connecting the supporting member 3 to the frames 4, the solar cell module 1a and the supporting member 3 can integrally be handled. Therefore, the solar cell module 1a can be replaced in a state where the supporting member 3 is mounted thereon. A conventional solar cell module that is used in a heavy-snow region for example can easily be replaced by the solar cell module 1a having enhanced strength against a positive pressure load.

<<Second Embodiment>>

Next, a configuration of a photovoltaic power generating system 100a according to a second embodiment of the present invention will be described with reference to FIG. 7. In the description of this embodiment, elements having the same functions as those of the first embodiment are designated with the same symbols, and explanation thereof will be omitted. This also applies to other embodiments.

Figure 7:
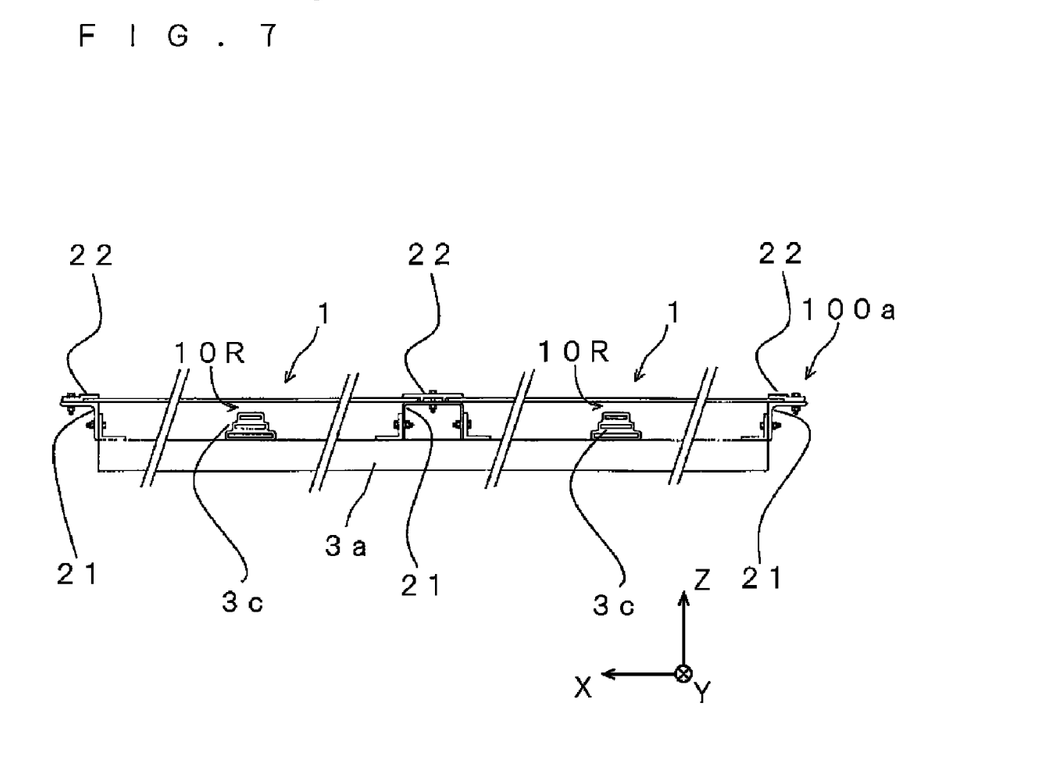
FIG. 7 a sectional view showing a photovoltaic power generating system according to a second embodiment of the present invention.

As shown in FIG. 7, the second embodiment includes a member 3a according to the first embodiment, and convex hollow supporting members 3c located above the member 3a.

Each of the supporting members 3c has a pyramidal shape whose cross section in the horizontal direction is gradually reduced toward the non-light-receiving surface 1B of the solar cell module 1. The supporting member 3c is made of elastic member (such as EPDM or natural rubber) so that it can be deformed when it abuts against the solar cell module 1.

According to this embodiment, if a positive pressure load applied to the solar cell module 1 is increased, since a contact area between the solar cell module 1 and the supporting member 3 is increased, stresses are dispersed. Therefore, since it is possible to reduce stresses from being applied to a portion of a back surface (non-light-receiving surface 1B) of the solar cell module 1 in a focused manner, destruction of the solar cell module 1 can be suppressed.

<<Third Embodiment>>

Figure 8A:
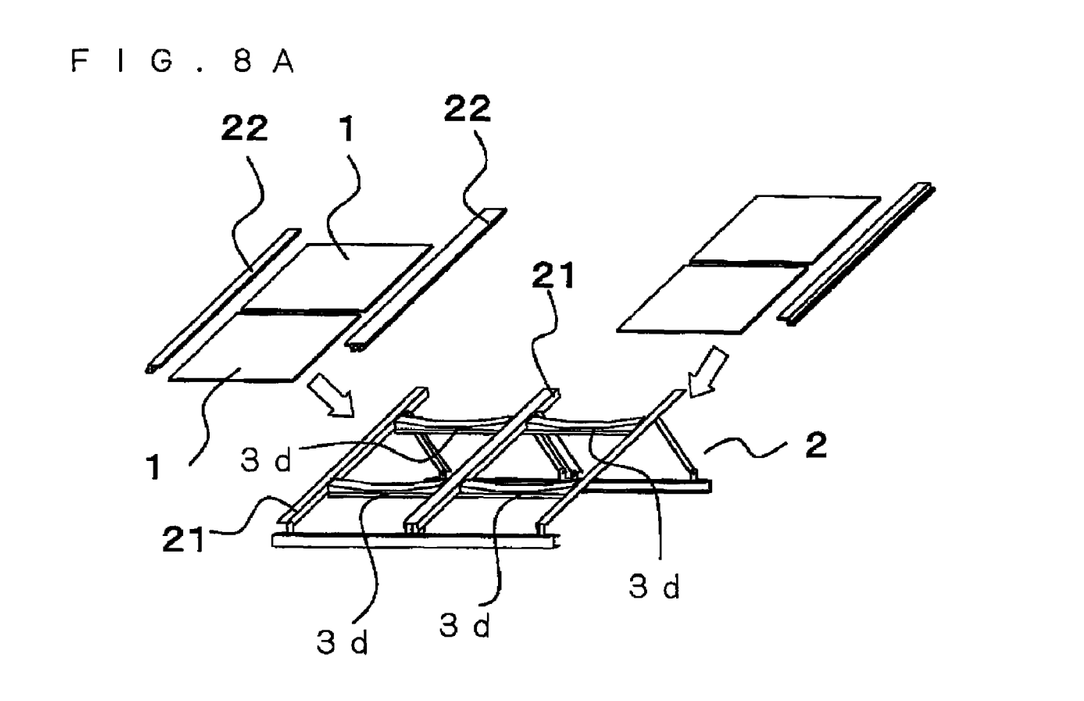
FIG. 8A is an exploded perspective view showing a state before solar cell modules are installed.
Figure 8B:
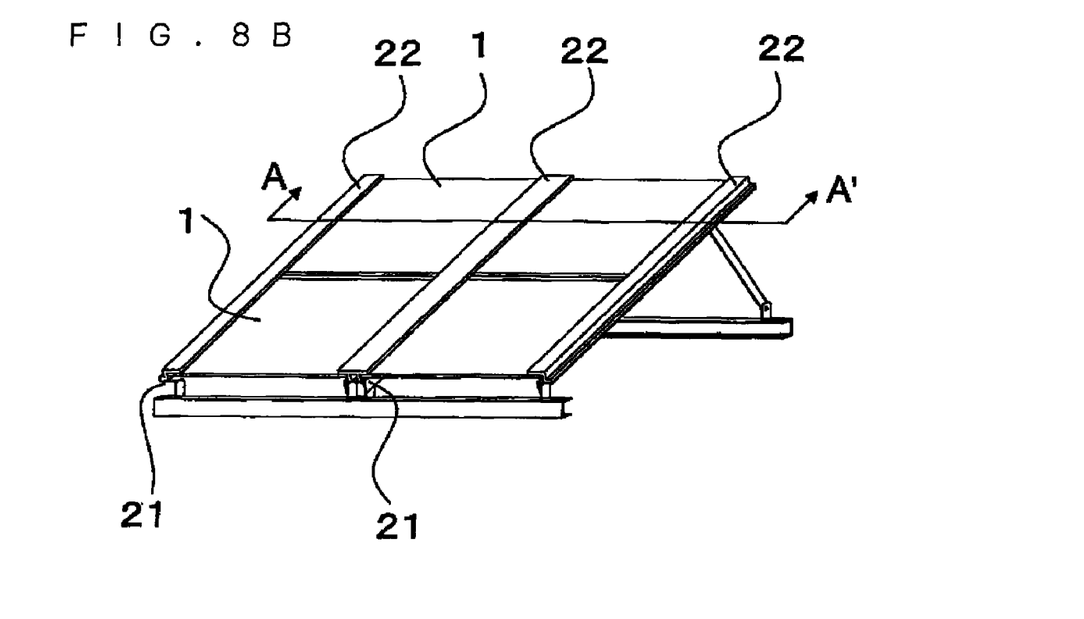
FIG. 8B is a perspective view showing a state after the solar cell modules are installed.

According to a third embodiment of the present invention, as shown in FIG. 8A, supporting members 3d are provided on the side of the non-light-receiving surface 1B of the solar cell module 1. A distance between the supporting member 3d and the solar cell module 1 is set such that the distance becomes gradually smaller from a center portion toward end edges of the solar cell module 1. More specifically, a supporting surface 3dS of each of the supporting members 3d is curved in a concave manner with respect to the non-light-receiving surface 1B.

It is preferable that a distance between the supporting member 3d and the solar cell module 1 at each position is set such that the distance is smaller than a limit value of a bending amount of the solar cell module 1 at each position. It is preferable that the distance between the solar cell module 1 and the supporting member 3d is set such that the distance becomes the maximum at a center part of the solar cell module 1 when the center part of the solar cell module 1 is superposed on the supporting member 3d as viewed from above in a see-through manner.

Figure 9A:
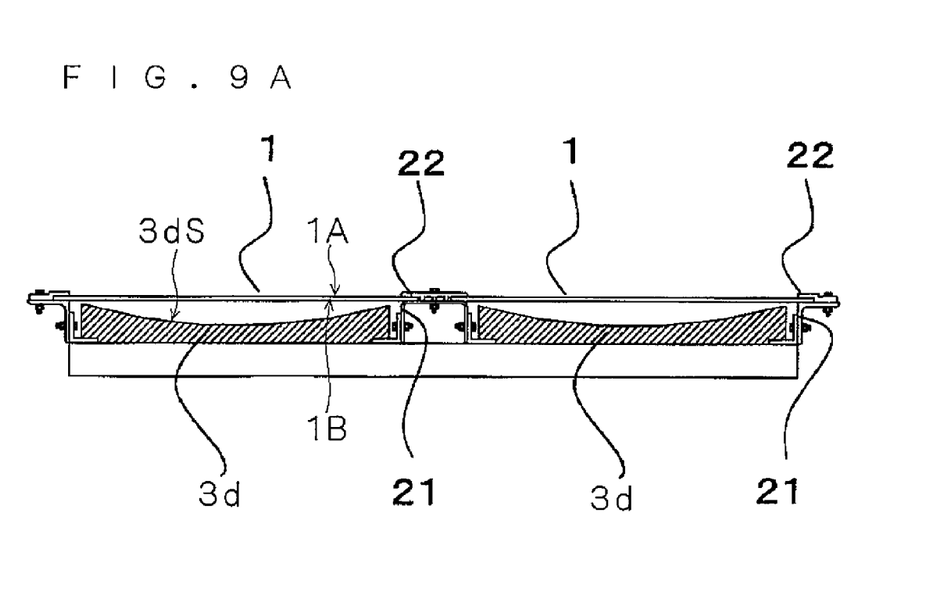
FIG. 9A shows a state where a positive pressure load is not applied to the solar cell modules from external.

As shown in FIG. 9A, each of the solar cell modules 1 is substantially flat when no load is applied from external. If a predetermined positive pressure load is applied to the light-receiving surface 1A of the solar cell module 1, the solar cell module 1 is bent and is supported by a portion of the supporting surface 3dS of the supporting member 3d (not shown). At that time, since the supporting member 3d supports the solar cell module 1 in accordance with this bent shape, a curved amount of the solar cell module 1 in the vicinity of the supporting member 3d is reduced, and generation of a breakage of the transparent substrate 11, a crack of the solar cell element 14 and the like is reduced.

Figure 9B:
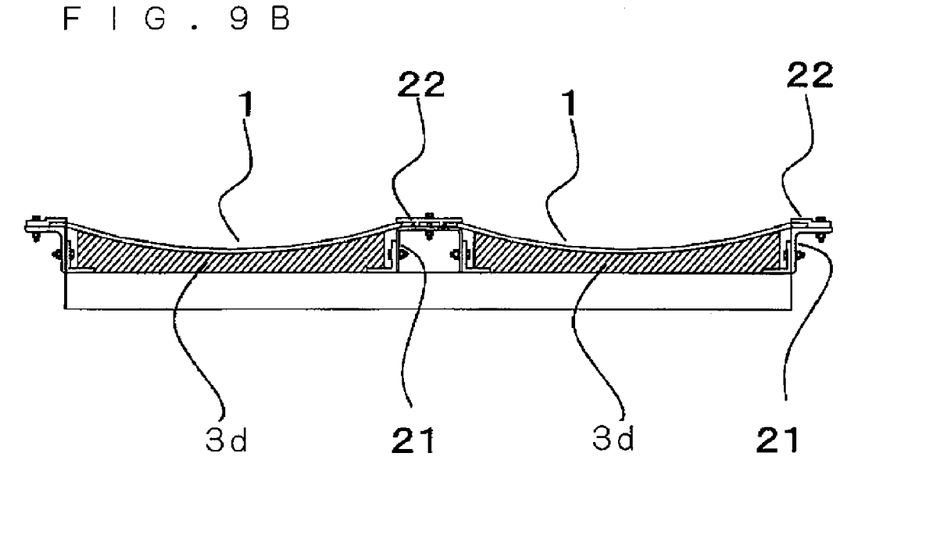
FIG. 9B shows a state where the positive pressure load is applied to the solar cell modules from external.

If a greater load is applied to the solar cell module 1, the non-light-receiving surface 1B and substantially the entire surface of the supporting member 3d come into contact with each other as shown in FIG. 9B. At that time, since the supporting member 3 supports the solar cell module 1 on the side of the non-light-receiving surface 113 with a relatively large surface, a pressure applied to the solar cell element 14 can be reduced. Since the supporting member 3d supports a fixed part area of the peripheral edge of the solar cell module 1, bending near the fixed part is reduced. This can reduce the generation of a breakage of the transparent substrate 11, a crack of the solar cell element 14 and the like. Therefore, the load-carrying capacity of a photovoltaic power generating system 100b can be enhanced.

Figure 10:
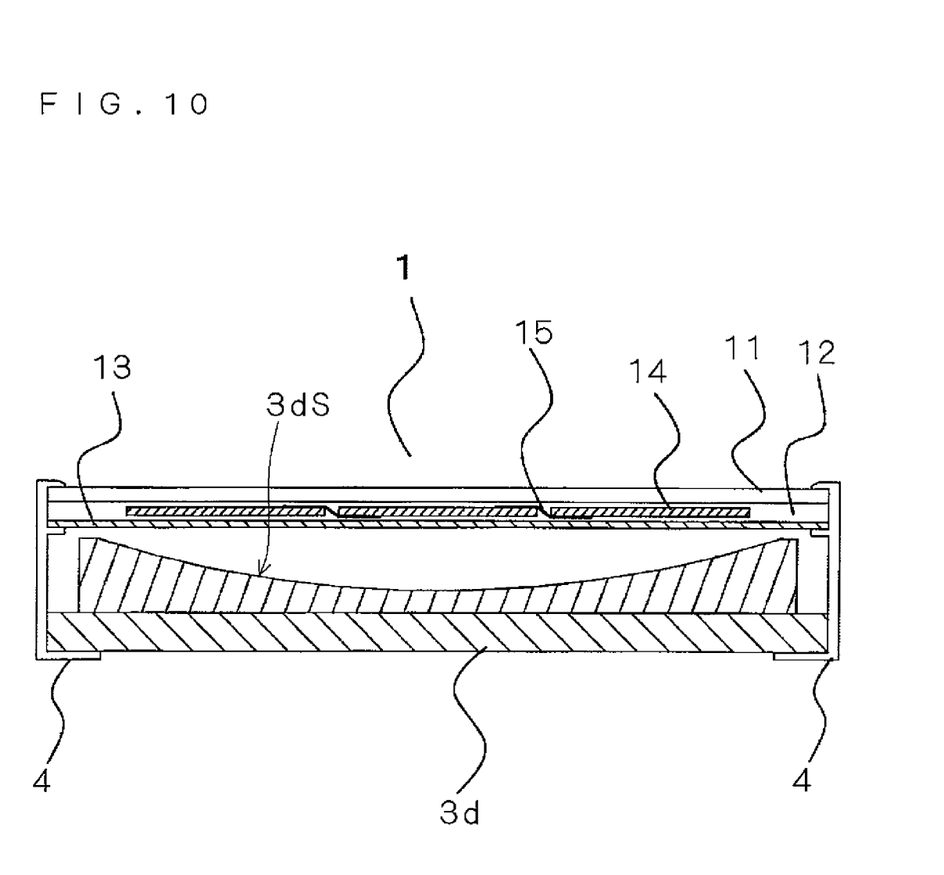
FIG. 10 a view showing a modification of the photovoltaic power generating system according to the third embodiment of the present invention.

For one solar cell module 1, a plurality of supporting members 3 may be disposed in parallel. The supporting surface 3dS of the supporting member 3 may have almost the same width as that of the solar cell module 1. The supporting member 3d can also be applied to the solar cell module 1a having the frames 4 as shown in FIG. 10. In this case, the supporting member 3d is provided into the frames 4.

<<Fourth Embodiment>>

Figure 11:
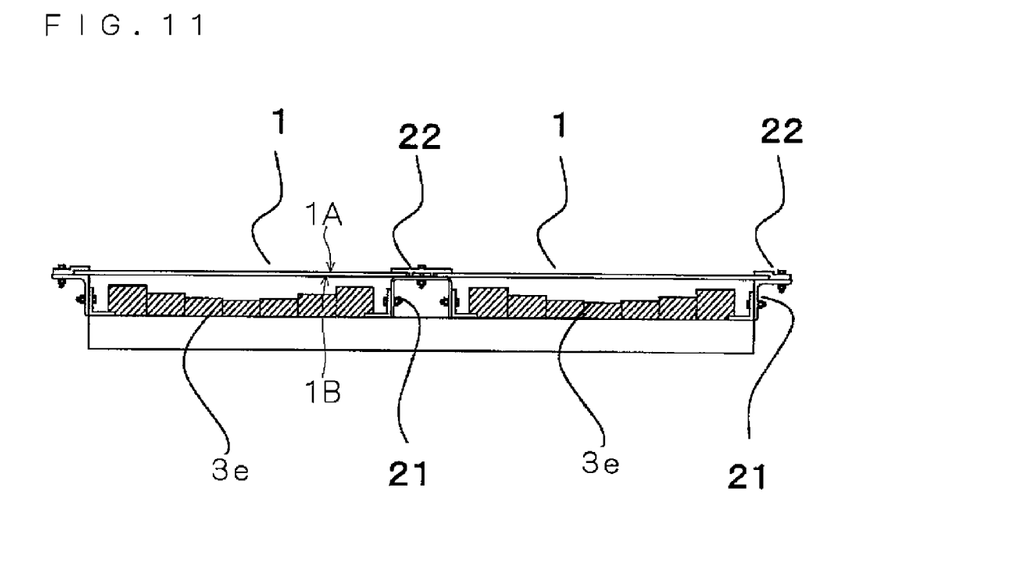
FIG. 11 a view showing a photovoltaic power generating system according to a fourth embodiment of the present invention.

Although the surface of the supporting member 3d is curved in shape, the supporting member 3d is not limited to this shape. In a fourth embodiment of the present invention, as shown in FIG. 11, supporting members 3e are provided on the side of the non-light-receiving surface 1B of the solar cell modules 1. Each of the supporting members 3e has a supporting surface that is varied such that it includes steps (in a stepwise fashion) in the height direction. By varying the height of the supporting member 3e in the stepwise fashion in this manner, its machining operation becomes easy as compared with a case where the supporting surface is formed into the curved surface.

It is also possible to form the supporting member 3e by combining members having different heights. In this case, it becomes easy to adjust the height of the supporting member 3e and to install the same at the construction site. That is, it is possible to make fine adjustments of the height in accordance with the installation environment.

When the supporting member 3e supports a bent solar cell module 1, it is preferable that the supporting member 3e is disposed such that the step portions and the solar cell element 14 are not superposed on each other. According to this, it is possible to reduce the generation of a crack in the solar cell element 14.

<<Fifth Embodiment>>

Figure 12:
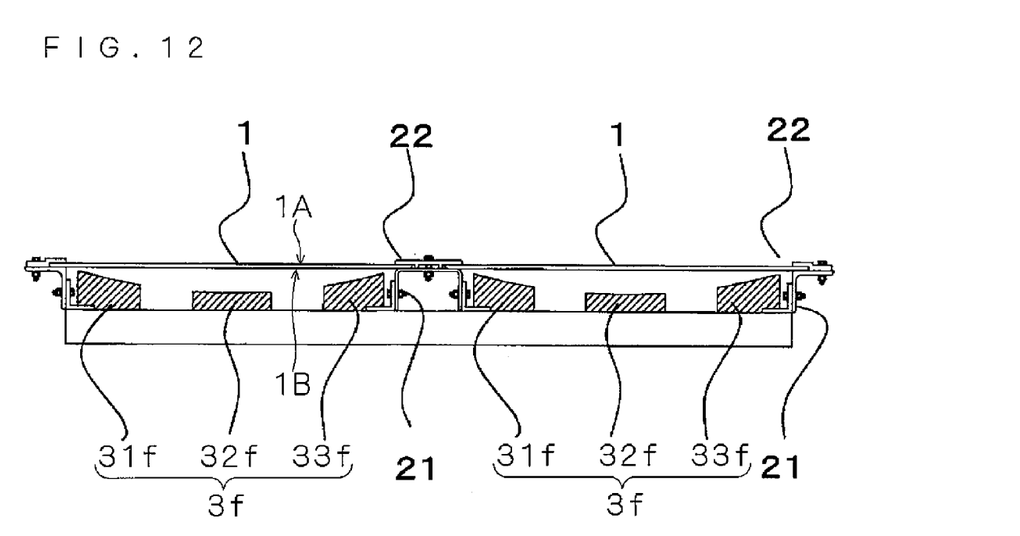
FIG. 12 a view showing a photovoltaic power generating system according to a fifth embodiment of the present invention.

In a fifth embodiment of the present invention, supporting member including a plurality of partial supporting members is used. More specifically, as shown in FIG. 12, each of the supporting members 3f includes partial supporting members 31f, 32f and 33f provided at predetermined distances from one another between the pair of ends of the solar cell module 1 on the side of the non-light-receiving surface 1B of the solar cell module 1. A supporting surface of each of the partial supporting members 31f, 32f and 33f forms a portion of a concave-curved surface like the supporting surface 3dS of the supporting member 3d.

According to the supporting members 3f, material costs and the number of manufacturing steps can be reduced. Further, since a space between the supporting members can be secured below the non-light-receiving surface 1B of the solar cell module 1, a flow rate of air is increased and the cooling efficiency of the solar cell module 1 can be enhanced. Further, even when the supporting member 3f and the non-light-receiving surface 1B abut against each other, since air passes through the space between the partial supporting members, the solar cell module 1 can be cooled, and reduction of power generating efficiency can be suppressed.

Since a cable and the like for connecting the solar cell modules 1 with each other can be accommodated in the space between the partial supporting members, even if the solar cell module 1 and the supporting member 3f come into contact with each other, it is possible to suppress a case where the cable is sandwiched therebetween.

<<Sixth Embodiment>>

Figure 13A:
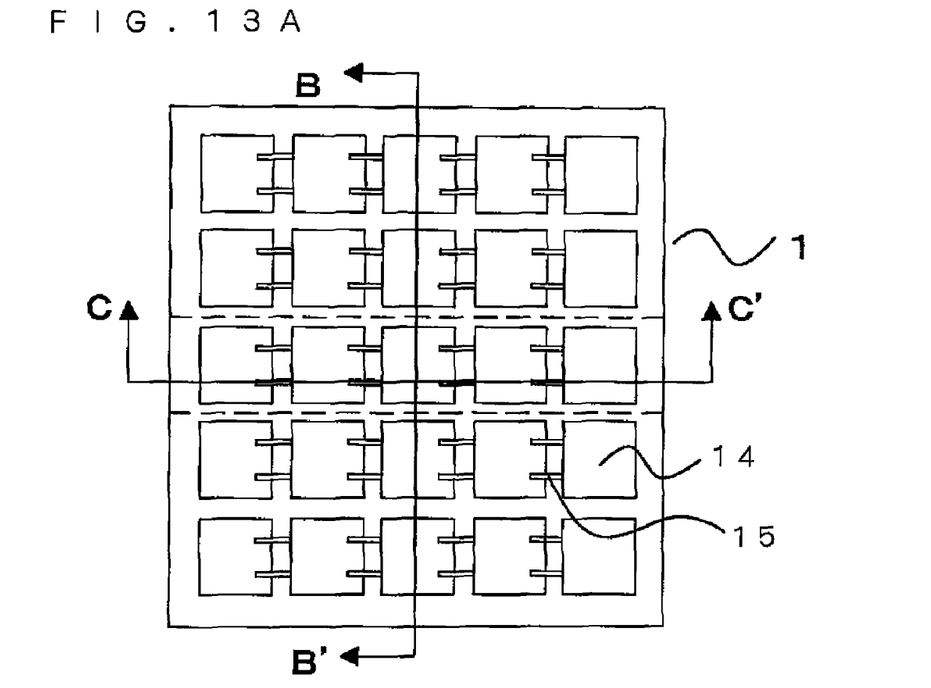
FIG. 13A is a plan view.
Figure 13B:
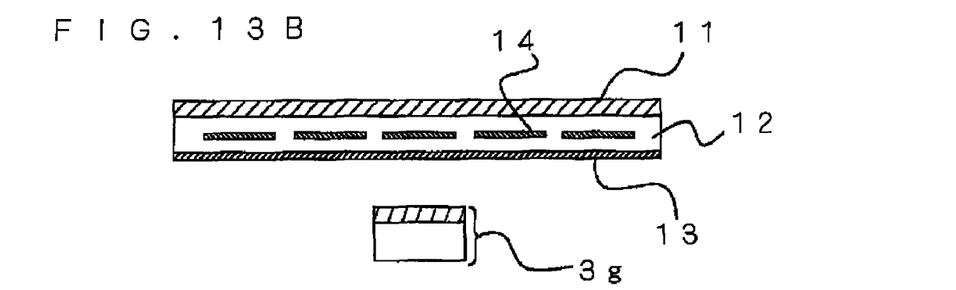
FIG. 13B is a sectional view taken along line B-B' shown in FIG. 13A.
Figure 13C:
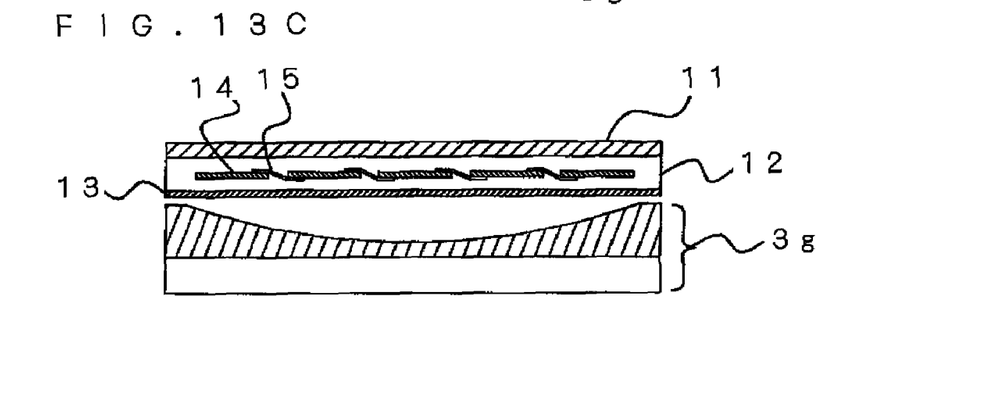
FIG. 13C is a sectional view taken along line C-C' shown in FIG. 13A.

In a sixth embodiment of the present invention, as shown in FIGS. 13A to 13C, a supporting surface of a supporting member 3g is concave-curved like the supporting member 3d, and the supporting member 3g includes a thin and long shape as viewed from above. As viewed from above in a see-through manner, the supporting member 3g is disposed such that both ends thereof in its lateral direction are located between the solar cell elements 14 (see FIG. 13B), and both ends of the supporting member 3g in its longitudinal direction are not superposed on the solar cell element 14 (see FIG. 13C).

When the supporting member 3g supports the solar cell module 1, it is possible to reduce a pressure applied directly to the solar cell element 14. Therefore, it is possible to reduce generation of a crack in the solar cell element 14.

As shown in FIGS. 13A to 13C, the supporting member 3g is disposed such that its longitudinal direction becomes equal to a connecting direction of an inner lead 15 that straightly connects the solar cell elements 14 with each other. The supporting member 3g is disposed such that its side end and the inner lead 15 are not superposed on each other. According to this, when the supporting member 3g supports the solar cell module 1, a pressure applied directly to the inner lead 15 can be reduced, and it is possible to suppress a case where connected parts between the solar cell element 14 and the inner lead 15 come off from each other, and a case where a crack is generated in the solar cell element 14 in the vicinity of the connected parts.

<<Seventh Embodiment>>

Figure 14A:
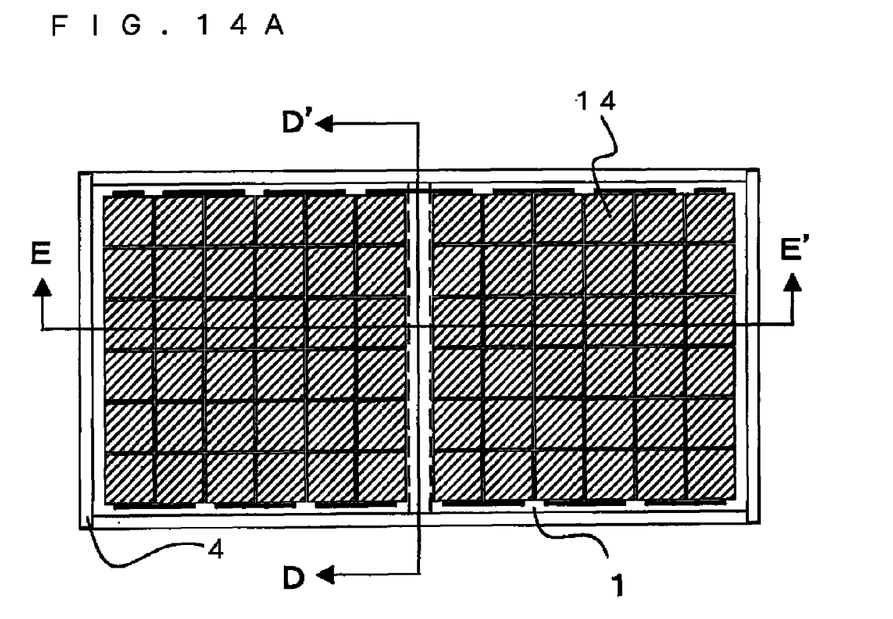
FIG. 14A is a plan view.
Figure 14B:
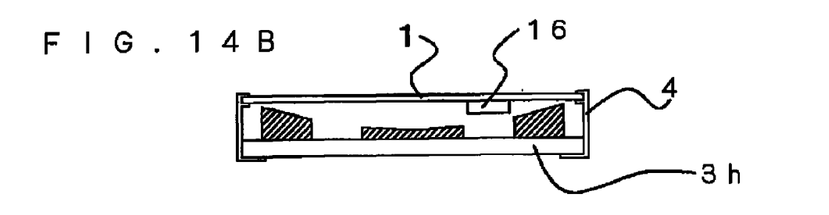
FIG. 14B is a sectional view taken along line D-D' shown in FIG. 14A.
Figure 14C:
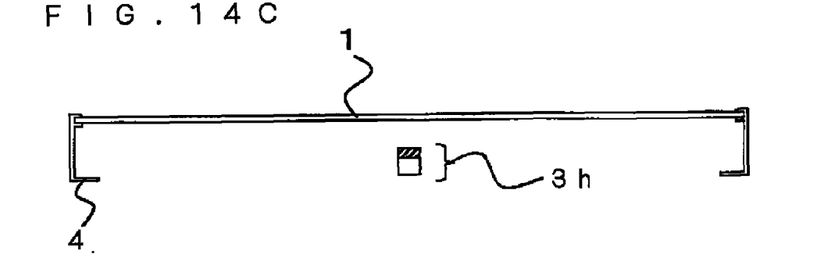
FIG. 14C is a sectional view taken along line E-E' shown in FIG.

In a photovoltaic power generating system according to a seventh embodiment of the present invention, as shown in FIGS. 14A to 14C, a straight non-disposition part where the solar cell element 14 is not disposed is provided substantially at a central part of the solar cell module 1. A supporting member 3h includes a plurality of partial supporting members, and is disposed such that the supporting member 3h is superposed on the non-disposition part, i.e., such that the supporting member 3h is not superposed on disposition parts as viewed from above in a see-through manner. According to this, when the supporting member 3h supports the solar cell module 1, a pressure applied to the solar cell element 14 is reduced, and generation of a crack in the solar cell element 14 can be reduced.

<<Modification>>

The present invention is not limited to the embodiments, and can variously be modified and changed within the scope of the present invention.

For example, the embodiments have been described using the inclined installation platform disposed on a flat roof or the ground, but the shape of the installation platform 2 is not limited to this. The present invention can preferably be utilized also for an on-roof type photovoltaic power generating system and a roofing type photovoltaic power generating system.

In the embodiments, the supporting structure of the solar cell module 1 has been described as being analogous to a two-dimensional simple supporting beam. However, even if other supporting structure is employed, a value of positive bending moment and a value of negative bending moment can be adjusted by disposing the supporting member 3 such that it is separated from the non-light-receiving surface 1B of the solar cell module 1 by an arbitrary distance.

Figure 15A:
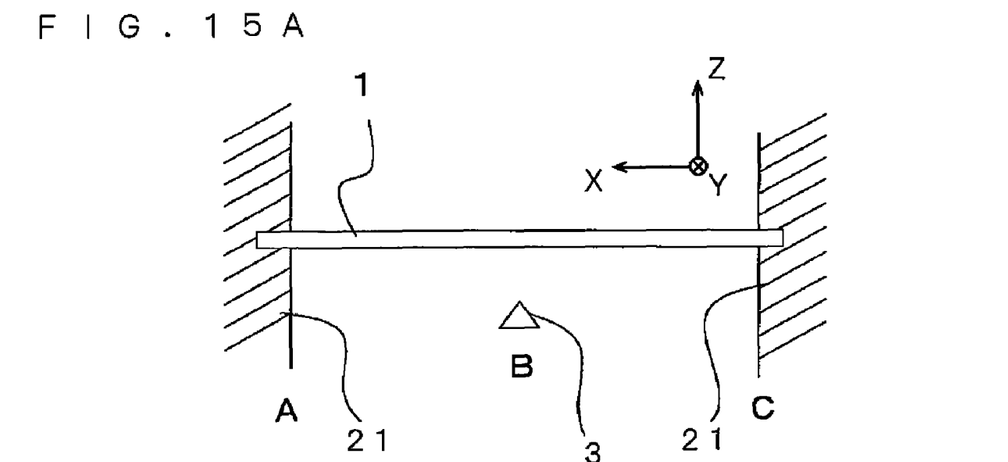
FIG. 15A is a modeled schematic diagram of a case where holding members are fixed ends.
Figure 15B:
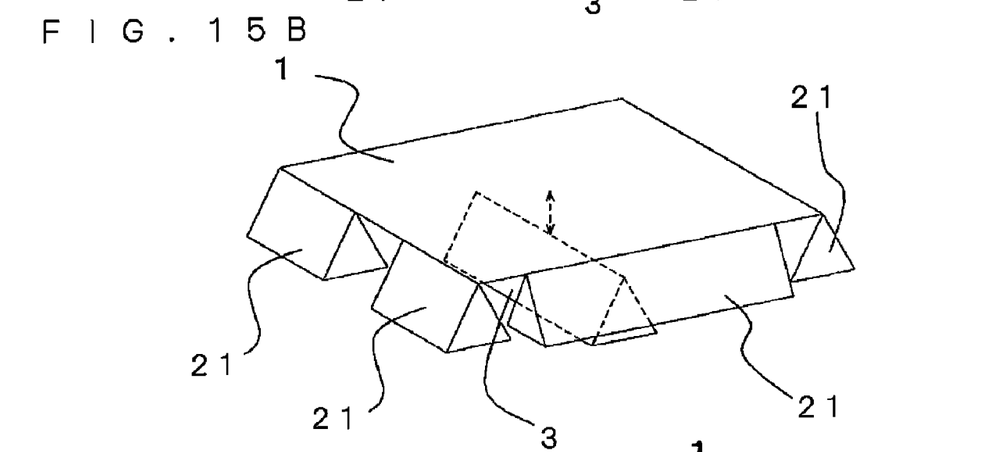
FIG. 15B is a perspective view showing a case where three sides of the solar cell module are fixed, and one of them is partially fixed.
Figure 15C:
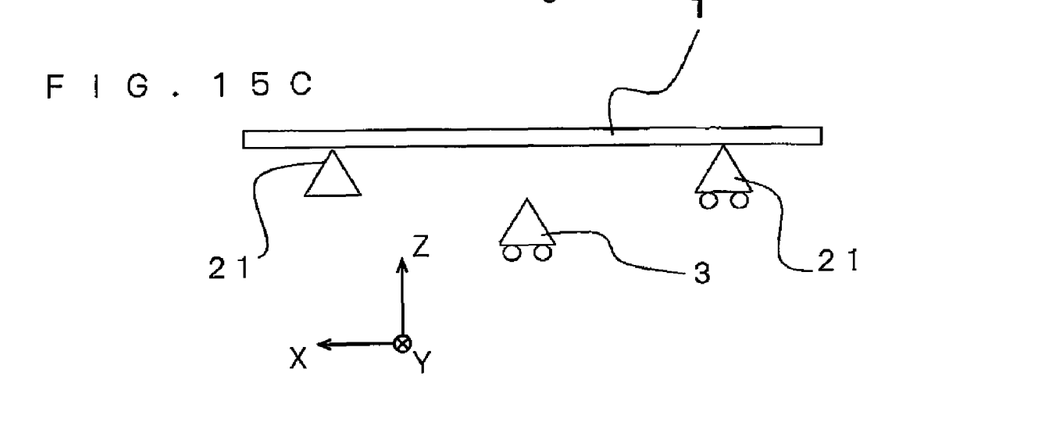
FIG. 15C is a modeled schematic diagram of a case where the solar cell module is fixed by the holding members at positions inward from both ends of the solar cell module.

That is, as shown in FIG. 15A, the holding members 21 may be fixed ends that can neither move nor rotate. The holding members 21 that fix the pair of ends of the solar cell module 1 are not limited to a structure that opposed two sides are fixed as in the simple supporting beam, and three or four sides of a rectangular solar cell module may be fixed as shown in FIG. 15B, or the holding member 21 may be shorter than a length of one side of the solar cell module. As an example of this case, a frameless type solar cell module 1 may be partially fixed to an installation platform 2 by a locking member 22. In this case, material used for the installation platform 2 can be reduced. That is, material used for the installation platform 2 can be reduced by providing the supporting member 3. Further, as shown in FIG. 15C, the solar cell module 1 may be fixed at positions slightly closer to a central part than end sides of the solar cell module 1 like a projecting beam.

The invention claimed is:

1. A photovoltaic power generating system, comprising:
 a solar cell module;
 an installation platform for holding a pair of ends of said solar cell module; and
 at least one supporting member disposed on a side of a non-light-receiving surface of said solar cell module, wherein
 said supporting member is disposed at a non-zero distance from the non-light-receiving surface of said solar cell module such that said supporting member can abut against the non-light-receiving surface by deformation of said solar cell module, and said supporting member has, at a central part of said solar cell module, a convex part projecting toward said solar cell module.

2. The photovoltaic power generating system according to claim 1, wherein
a deforming amount of said solar cell module is increased in accordance with an external force applied to said solar cell module.

3. The photovoltaic power generating system according to claim 1, wherein
a supporting surface of said supporting member includes a step.

4. The photovoltaic power generating system according to claim 1, wherein
said at least one supporting member is disposed such that it is superposed on a center part of said solar cell module as viewed from above in a see-through manner.

5. The photovoltaic power generating system according to claim 1, wherein
a distance between said solar cell module and said supporting member has a distance $\delta$ in which an absolute value of a maximum bending moment and an absolute value of a minimum bending moment generated in said solar cell module become equal to each other when a permissible maximum load is applied to a light-receiving surface of said solar cell module as a maximum value.

6. The photovoltaic power generating system according to claim 5, wherein
a distance between a center part of said solar cell module and said supporting member is said distance $\delta$.

* * * * *